(12) United States Patent
Jeong

(10) Patent No.: US 8,008,098 B2
(45) Date of Patent: Aug. 30, 2011

(54) LIGHT EMITTING DEVICE AND METHOD OF MANUFACTURING THE SAME

(75) Inventor: Hwan Hee Jeong, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 170 days.

(21) Appl. No.: 12/514,600

(22) PCT Filed: Jul. 17, 2008

(86) PCT No.: PCT/KR2008/004195
§ 371 (c)(1),
(2), (4) Date: May 13, 2009

(87) PCT Pub. No.: WO2009/014345
PCT Pub. Date: Jan. 29, 2009

(65) Prior Publication Data
US 2010/0059769 A1    Mar. 11, 2010

(30) Foreign Application Priority Data
Jul. 23, 2007  (KR) .................. 10-2007-0073271

(51) Int. Cl.
*H01L 21/00* (2006.01)
*H01L 33/00* (2006.01)

(52) U.S. Cl. ............... 438/22; 257/88; 257/E33.055
(58) Field of Classification Search .............. 257/94, 257/103, E33.005, E33.013, E33.055, 88, 257/79, 99; 438/33, 22, 34, 36
See application file for complete search history.

(56) References Cited

U.S. PATENT DOCUMENTS
4,149,175 A * 4/1979 Inoue et al. .............. 257/94
6,884,646 B1 * 4/2005 Wu et al. .................. 438/22

FOREIGN PATENT DOCUMENTS
| JP | 2007-81312 A | 3/2007 |
| KR | 10-0622818 B1 | 9/2006 |
| WO | WO-02/19439 A1 | 3/2002 |
| WO | WO-2006/023088 A2 | 3/2006 |

* cited by examiner

*Primary Examiner* — Thomas L Dickey
*Assistant Examiner* — Nikolay Yushin
(74) *Attorney, Agent, or Firm* — Birch, Stewart, Kolasch & Birch, LLP

(57) ABSTRACT

A method of manufacturing a light emitting device is provided. An epitaxial layer is first formed at a plurality of separated regions on a substrate and a second electrode layer is formed on the epitaxial layer. Subsequently, the substrate is removed from the epitaxial layer and a first electrode layer is formed under the epitaxial layer, after which the second electrode layer is divided into chip units.

18 Claims, 3 Drawing Sheets

[Fig. 1]
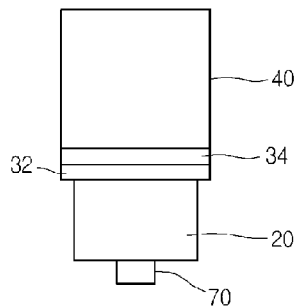
[Fig. 2]
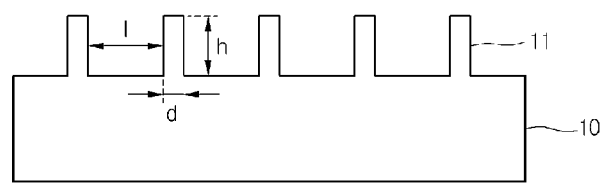
[Fig. 3]
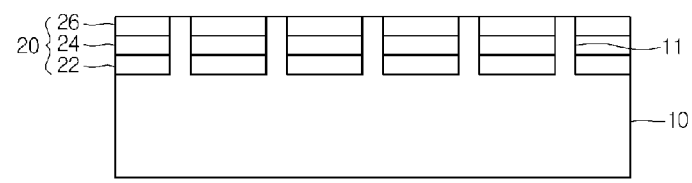
[Fig. 4]
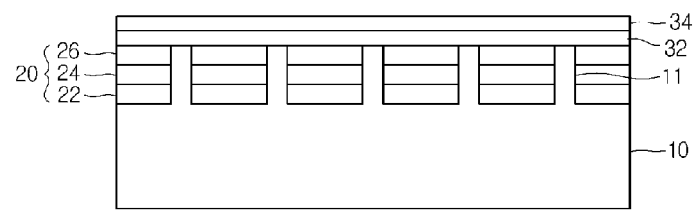
[Fig. 5]
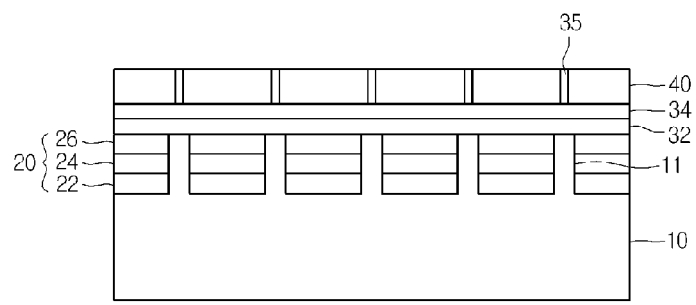

[Fig. 6]
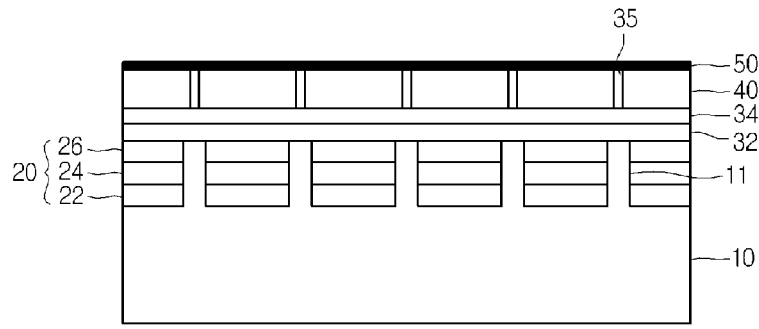
[Fig. 7]
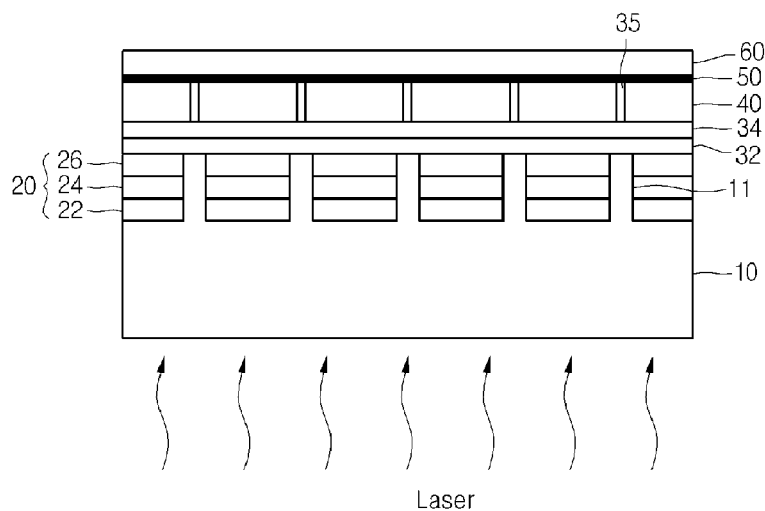
[Fig. 8]
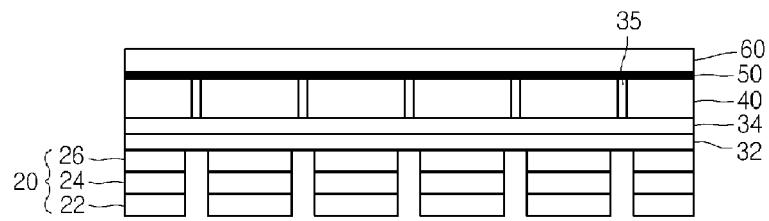
[Fig. 9]
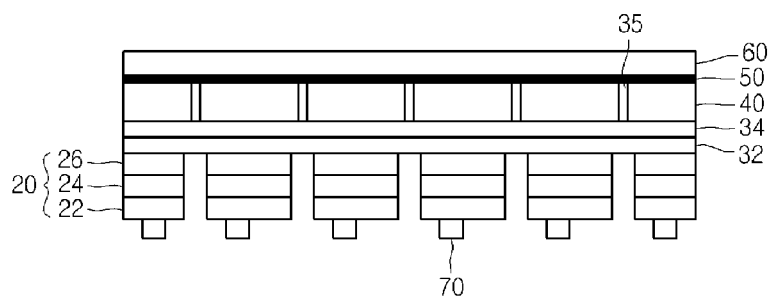

[Fig. 10]
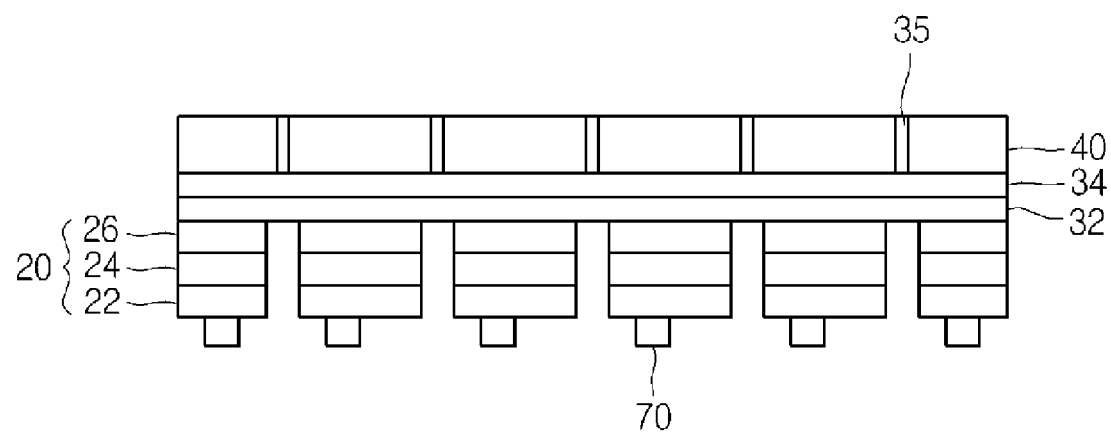

LIGHT EMITTING DEVICE AND METHOD OF MANUFACTURING THE SAME

TECHNICAL FIELD

The present disclosure relates to a light emitting device and a method of manufacturing the same.

BACKGROUND ART

A light emitting diode (LED) that can emit infrared rays or visible rays using a compound semiconductor is the representative of light emitting devices.

The light emitting device includes a substrate, an epitaxial layer including a first conductive semiconductor layer, an active layer, and a second conductive semi-conductor layer on the substrate. The substrate and the epitaxial layer are divided into a plurality of chip units through a scribing process, thereby completing the light emitting device.

However, in the course of dividing the substrate and the epitaxial layer through the scribing process, the epitaxial layer may be damaged and thus the light emitting device does not normally operate or the luminance of the light emitting device is deteriorated.

DISCLOSURE OF INVENTION

Technical Problem

Embodiments provide a light emitting device and a method of manufacturing the same.

Embodiments also provide a light emitting device and a method of manufacturing the light emitting device that is designed not to be damaged during a process for dividing an epitaxial layer into a plurality of the light emitting devices.

Technical Solution

In an embodiment, a method of manufacturing a light emitting device comprises forming an epitaxial layer at a plurality of separated regions on a substrate; forming a second electrode layer on the epitaxial layer; removing the substrate from the epitaxial layer; forming a first electrode layer under the epitaxial layer; and dividing the second electrode layer in chip units.

In an embodiment, a light emitting device includes a first electrode layer; an epitaxial layer on the first electrode layer; and a second electrode layer on the epitaxial layer, the second electrode layer having a larger area than the epitaxial layer.

The details of one or more embodiments are set forth in the accompanying drawings and the description below. Other features will be apparent from the description and drawings, and from the claims.

Advantageous Effects

According to the embodiments, the damage of the epitaxial layer, which may be caused during a process for dividing the epitaxial layer into a plurality of light emitting devices, can be reduced.

BRIEF DESCRIPTION OF THE DRAWINGS

FIG. 1 is a schematic diagram of a light emitting device according to an embodiment.

FIGS. 2 to 10 are diagrams illustrating a method of manufacturing a light emitting device according to an embodiment.

MODE FOR THE INVENTION

Reference will now be made in detail to the embodiments of the present disclosure, examples of which are illustrated in the accompanying drawings.

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present.

In the figures, the dimensions of layers and regions are exaggerated for clarity of illustration. In addition, the dimension of each part does not reflect an actual size.

FIG. 1 is a schematic diagram of a light emitting device after being divided into a chip unit according to an embodiment.

That is, FIG. 1 illustrates one of light emitting devices that are formed on a single substrate and divided into a plurality of chip units.

A light emitting device according to an embodiment includes an epitaxial layer 20 including a first conductive semiconductor layer, an active layer and a second conductive semiconductor layer, a first electrode layer 70 formed under the epitaxial layer 20, an ohmic contact layer 32 formed on the epitaxial layer 20, a seed layer 34, and a second electrode layer 40.

The ohmic contact layer 32 and the seed layer 34 may be selectively omitted.

The epitaxial layer 20 is formed to have a smaller area than each of the ohmic contact layer 32, seed layer 34, and second electrode layer 40. That is, in a cross-sectional view, the epitaxial layer 20 is formed to have a smaller width than each of the ohmic layer 32, seed layer 34, and second electrode layer 40.

The side surfaces of the ohmic contact layer 32, seed layer 34, and second electrode layer 40 may be formed on a same vertical plane.

The light emitting device having the above construction can be formed using a method of manufacturing the light emitting device, which will be described below.

The following will describe the method of manufacturing the light emitting device according to an embodiment with reference to FIGS. 2 to 10.

FIG. 2 is a side sectional view illustrating that a plurality of barrier ribs are formed on a substrate 10.

The barrier ribs 11 are formed by selectively patterning the substrate 10. The barrier ribs 11 may be formed through a photoresist process and an etching process.

The substrate 10 may be formed of, for example, sapphire, SiC, or Si.

The barrier ribs 11 are formed to have a width d of 5-100 μm and a height of 3-10 μm. On each of regions between the barrier ribs 11, the epitaxial layer 20 having the first conductive semiconductor layer 22, active layer 24, and second conductive semi-conductor layer 26 is formed. The barrier ribs 11 are structures that function as separation regions when the epitaxial layer 20 is separated as a unit chip.

Since the epitaxial layer 20 is formed on the region between the barrier ribs 11, a gap 1 between the barrier ribs 11 is identical to the width of the epitaxial layer 20 illustrated in FIG. 1.

In order to form the barrier ribs 11, a photoresist pattern (not shown) is first formed on the substrate 10 and the substrate 10 is selectively etched while using the photoresist pattern as a mask.

FIG. 3 is a side sectional view illustrating the light emitting device after the epitaxial layer 20 is formed on the substrate 10 according to the method of manufacturing the light emitting device of the embodiment.

The epitaxial layer 20 is formed on the regions between the barrier ribs 11.

The epitaxial layer 20 may include the first conductive semiconductor layer 22, active layer 24, and second conductive semiconductor layer 26. For example, the first conductive semiconductor layer 22 may be an N-type semiconductor layer and the second conductive semiconductor layer 26 may be a P-type semiconductor layer.

The epitaxial layer 20 may further include other layers in addition to the above layers. For example, the epitaxial layer may further include a buffer layer and an undoped GaN layer that are formed between the substrate 10 and the first conductive semiconductor layer 22.

The active layer 24 may be formed in a multi-quantum well structure including an InGAN/GaN structure. Light is generated as the holes of the second conductive semi-conductor layer 26 and electrons of the first conductive semiconductor layer 22 are joined together at the active layer 24.

The epitaxial layer 20 may be formed to have a thickness of 3-10 μm. That is, a thickness of the epitaxial layer 20 may be same as or identical to the height of the barrier rib 11.

FIG. 4 is a side sectional view illustrating the light emitting device after the ohmic layer 32 and seed layer 34 are formed on the epitaxial layer 20 according to the method of manufacturing the light emitting device of the embodiment. FIG. 5 is a side sectional view illustrating the light emitting device after the photoresist pattern 35 and second electrode layer 40 are formed according to the method of manufacturing the light emitting device of the embodiment.

After the epitaxial layer 20 is formed, the ohmic contact layer 32 and seed layer 34 are formed on the epitaxial layer 20 and barrier ribs 11.

The ohmic contact layer 32 may be a transparent electrode layer. For example, the ohmic contact layer 32 may be formed on at least one of Ni, IZO, ITO, ZnO, $RuO_x$, and $IrO_x$.

The seed layer 34 may be formed by depositing, for example, Ni/Ag, Ni/Cu, and the like.

The ohmic contact layer 32 reduces an ohmic resistance to allow a current to flow effectively to the second conductive semiconductor layer 26. The seed layer 34 functions to enhance an adhesiveness of the second electrode layer 40.

Alternatively, at least one of the ohmic contact layer 32 and seed layer 34 may be omitted.

Referring to FIG. 5, the photoresist pattern 35 is formed on the seed layer 34. The photoresist pattern 35 functions to make it easy to perform the chip unit separation. Therefore, the photoresist pattern 35 is formed at a location corresponding to the barrier ribs 11.

However, the photoresist pattern 35 may be omitted. In this case, a laser scribing process may be further performed. This will be described in more detail later with reference to FIG. 9.

Next, the second electrode layer 40 is formed on regions defined by the photoresist pattern 35 on the seed layer 34.

If the ohmic contact layer 32 and seed layer 34 are omitted, the photoresist pattern 35 may be formed on the barrier ribs 11.

FIG. 6 is a side sectional view illustrating the light emitting device after the first electrode layer 40 and an etch stop layer 50 are formed according to the method of manufacturing the light emitting device of the embodiment and FIG. 7 is a side sectional view illustrating the light emitting device after a supporting layer 60 is formed on the etch stop layer 50 according to the method of manufacturing the light emitting device of the embodiment. In addition, FIG. 8 is a side sectional view illustrating the light emitting device after the substrate 10 is removed according to the method of manufacturing the light emitting device of the embodiment.

Referring to FIGS. 6 and 7, the etch stop layer 50 is formed on the second electrode layer 40 and the supporting layer 60 is formed on the etch stop layer 50 by plating a metal material such as Cu, Ni, or the like.

The supporting layer 60 functions to support the epitaxial layer 20 in a process for removing the substrate 11 or forming the first electrode layer 70.

After forming the supporting layer 60, the substrate 10 including the barrier ribs 11 are removed. For example, the substrate 10 including the barrier ribs 11 may be removed by radiating laser.

Therefore, as shown in FIG. 8, the light emitting device that is separated in a chip unit from the epitaxial layer 20 is completed.

FIG. 9 is a side sectional view illustrating the light emitting device after the first electrode layer 70 is formed under the epitaxial layer 20 according to the method of manufacturing the light emitting device of the embodiment.

As shown in FIG. 9, the first electrode layer 70 is formed under the first conductive semiconductor layer 22 that is exposed by removing the substrate 10. The first electrode layer 70 may be formed of at least one of Ni, IZO, ITO, ZnO, $RuO_x$, and $IrO_x$.

At this point, the supporting layer 60 stably supports the epitaxial layer 20, ohmic contact layer 32, seed layer 34, and second electrode layer 40 in the process for forming the first electrode layer 70.

After forming the first electrode layer 70, the supporting layer 60 is removed through an etching process or a planarizing process. At this point, the etch stop layer 50 prevent the second electrode layer 40 from being removed.

The etch stop layer 50 may be removed through another etching process or another planarizing process after the supporting layer 60 is removed.

FIG. 10 is a side sectional view illustrating the light emitting device after the etch stop layer 50 and supporting layer 60 are removed according to the method of manufacturing the light emitting device of the embodiment.

After the etch stop layer 50 and the supporting layer 60 are removed, a separation process in a chip unit is performed.

Since the ohmic contact layer 32 and the seed layer 34 are formed to have a thickness of about 1 μm, it is easily separated even by relatively small force. In addition, since the second electrode layer 40 is connected by the photoresist pattern 35 on the seed layer 34, the second electrode layer 40 is also easily separated even by small force.

As described previously, when the photoresist pattern 35 is not formed, the laser scribing process is further preformed to divide the second electrode layer 40 into chip units.

Through the above-described processes, the light emitting device shown in FIG. 1 is completed.

In the related art, a process for dividing the epitaxial layer into chip units is performed after forming the epitaxial layer on the substrate. However, according to the embodiments, since the epitaxial layer 20 is naturally divided by the barrier ribs 11, there is no need to perform the chip unit dividing process for the epitaxial layer.

Therefore, according to the method of manufacturing the light emitting device of the embodiment, the damage of the epitaxial layer can be minimized.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments of the present disclosure can be applied to manufacture light emitting devices.

The invention claimed is:

1. A method of manufacturing a light emitting device, the method comprising:
   providing a substrate;
   forming a plurality of separated regions on the substrate;
   forming an epitaxial layer including at least an active layer within each of the separated regions;
   forming a second electrode layer on the epitaxial layer;
   removing the substrate from the epitaxial layer;
   forming a first electrode layer under the epitaxial layer; and
   dividing the second electrode layer in chip units.

2. The method according to claim 1, wherein the forming of the epitaxial layer comprises forming a plurality of barrier ribs on the substrate and forming the epitaxial layer at regions divided by the barrier ribs.

3. The method according to claim 2, wherein the barrier ribs are formed by selectively etching the substrate.

4. The method according to claim 2, wherein the second electrode layer is formed on the epitaxial layer and barrier ribs.

5. The method according to claim 1, comprising, before forming the second electrode layer on the epitaxial layer, forming at least one of an ohmic contact layer and a seed layer on the epitaxial layer.

6. The method according to claim 2, wherein the forming of the second electrode layer comprises forming a photoresist pattern at a location corresponding to the barrier ribs and forming the second electrode layer on regions divided by the photoresist pattern.

7. The method according to claim 5, wherein the forming of the second electrode layer comprises forming a photoresist pattern at a location on the ohmic contact layer or the seed layer corresponding to regions where the epitaxial layer is divided and forming the second electrode layer on regions divided by the photoresist pattern.

8. The method according to claim 1, comprising, after forming the second electrode layer on the epitaxial layer, forming an etch stop layer on the second electrode layer and forming a supporting layer on the etch stop layer.

9. The method according to claim 8, comprising, after forming the first electrode layer under the epitaxial layer, removing the supporting layer and the etch stop layer.

10. The method according to claim 1, wherein the dividing the second electrode layer is performed by a laser scribing process.

11. The method according to claim 1, wherein the epitaxial layer comprises a first conductive semiconductor layer, the active layer, and a second conductive semiconductor layer.

12. A light emitting device, comprising:
   a first electrode layer;
   an epitaxial layer on the first electrode layer;
   an ohmic contact layer on the epitaxial layer; and
   a second electrode layer on the epitaxial layer, the second electrode layer having a larger area than the epitaxial layer and having the same area as the ohmic contact layer.

13. The light emitting device according to claim 12, comprising a seed layer that is formed between the ohmic contact layer and the second electrode layer.

14. The light emitting device according to claim 12, wherein a side surface of the second electrode layer and side surfaces of the ohmic contact layer and seed layer are located at a same vertical plane.

15. The light emitting device according to claim 12, wherein the epitaxial layer comprises a first conductive semiconductor layer, an active layer, and a second conductive semiconductor layer.

16. The light emitting device according to claim 12, wherein the first electrode layer is formed of at least one of Ni, IZO, ITO, ZnO, $RuO_x$, and $IrO_x$.

17. The light emitting device according to claim 13, wherein the ohmic contact layer is formed of at least one of Ni, IZO, ITO, ZnO, $RuO_x$, and $IrO_x$.

18. The light emitting device according to claim 13, wherein the seed layer is formed of Ni/Ag or Ni/Cu.

* * * * *